(12) United States Patent
Jin et al.

(10) Patent No.: US 12,360,627 B2
(45) Date of Patent: Jul. 15, 2025

(54) DISPLAY DEVICE HAVING DISCHARGE PATTERNS IN A PAD AREA TO DISCHARGE STATIC ELECTRICITY INTRODUCED INTO A DRIVER

(71) Applicant: Samsung Display Co., LTD., Yongin-si (KR)

(72) Inventors: Jeongoh Jin, Hwaseong-si (KR); Cheolhwan Eom, Asan-si (KR); Jeong-Hun So, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 717 days.

(21) Appl. No.: 17/544,414

(22) Filed: Dec. 7, 2021

(65) Prior Publication Data
US 2022/0238627 A1 Jul. 28, 2022

(30) Foreign Application Priority Data

Jan. 22, 2021 (KR) .................... 10-2021-0009474

(51) Int. Cl.
| | | |
|---|---|---|
| G06F 3/041 | (2006.01) | |
| G06F 3/044 | (2006.01) | |
| H01L 25/18 | (2023.01) | |
| H10K 59/131 | (2023.01) | |
| H10K 59/40 | (2023.01) | |

(52) U.S. Cl.
CPC ........ *G06F 3/04164* (2019.05); *G06F 3/0412* (2013.01); *G06F 3/0443* (2019.05); *H10K 59/40* (2023.02); *G06F 2203/04107* (2013.01); *G06F 2203/04111* (2013.01); *H01L 25/18* (2013.01); *H10K 59/131* (2023.02)

(58) Field of Classification Search
CPC .. H10K 59/131; H10K 59/40; H10K 59/1213; G06F 3/0412; G06F 3/04164; G06F 3/0443; G06F 2203/04107; G06F 2203/04111; G06F 2203/04103; G06F 3/041; H01L 25/18; H01L 23/60; H01L 27/0248
See application file for complete search history.

(56) References Cited

U.S. PATENT DOCUMENTS

| | | | | |
|---|---|---|---|---|
| 9,792,867 | B2* | 10/2017 | Ohishi | ................ G02F 1/1345 |
| 10,503,297 | B2* | 12/2019 | Zeng | .................. H04M 1/0266 |
| 10,575,403 | B2* | 2/2020 | Park | ..................... G02F 1/1333 |

(Continued)

FOREIGN PATENT DOCUMENTS

| | | |
|---|---|---|
| JP | 6603608 | 11/2019 |
| KR | 10-2006-0125074 | 12/2006 |

(Continued)

*Primary Examiner* — Caleb E Henry
(74) *Attorney, Agent, or Firm* — KILE PARK REED & HOUTTEMAN PLLC

(57) ABSTRACT

A display device may include a substrate, input pads, output pads, a driver, discharge patterns, and ground lines. The substrate may include a display area and a pad area. The input pads may be disposed in a first portion of the pad area. The output pads may be disposed in a second portion of the pad area. The driver may be disposed on the input pads and the output pads. The discharge patterns may be disposed adjacent to the driver in the pad area. The ground lines may electrically connect the discharge patterns and at least one of the input pads in the pad area.

22 Claims, 12 Drawing Sheets

(56) References Cited

U.S. PATENT DOCUMENTS

| | | | | |
|---|---|---|---|---|
| 2007/0291042 | A1* | 12/2007 | Kwak | G09G 3/3688 345/535 |
| 2007/0296659 | A1* | 12/2007 | Kwak | G02F 1/13452 349/56 |
| 2013/0228867 | A1* | 9/2013 | Suematsu | H01L 23/60 257/355 |
| 2014/0117998 | A1* | 5/2014 | Hwang | G09G 3/006 324/511 |
| 2014/0217373 | A1* | 8/2014 | Youn | H10K 59/805 438/23 |
| 2014/0376135 | A1* | 12/2014 | Huo | H01L 27/0259 361/56 |
| 2015/0036300 | A1* | 2/2015 | Park | H05K 1/14 156/212 |
| 2015/0103500 | A1* | 4/2015 | Bae | H05K 1/111 228/102 |
| 2015/0270287 | A1* | 9/2015 | Kim | H10D 86/441 257/40 |
| 2016/0172428 | A1* | 6/2016 | Song | H10K 59/131 257/40 |
| 2017/0069616 | A1* | 3/2017 | Cai | H01L 27/0262 |
| 2017/0179112 | A1* | 6/2017 | Narita | H01L 27/0277 |
| 2018/0301520 | A1* | 10/2018 | Jin | H10K 59/80 |
| 2019/0179591 | A1* | 6/2019 | Kuo | H10K 59/18 |
| 2019/0281699 | A1* | 9/2019 | Bae | H05K 1/118 |
| 2019/0346953 | A1* | 11/2019 | Peng | G09G 3/20 |
| 2020/0312236 | A1* | 10/2020 | Ma | G09G 3/3225 |

FOREIGN PATENT DOCUMENTS

| | | |
|---|---|---|
| KR | 10-2013-0009466 | 1/2013 |
| KR | 10-2016-0083338 | 7/2016 |
| KR | 10-2107383 | 5/2020 |

* cited by examiner

FIG. 2
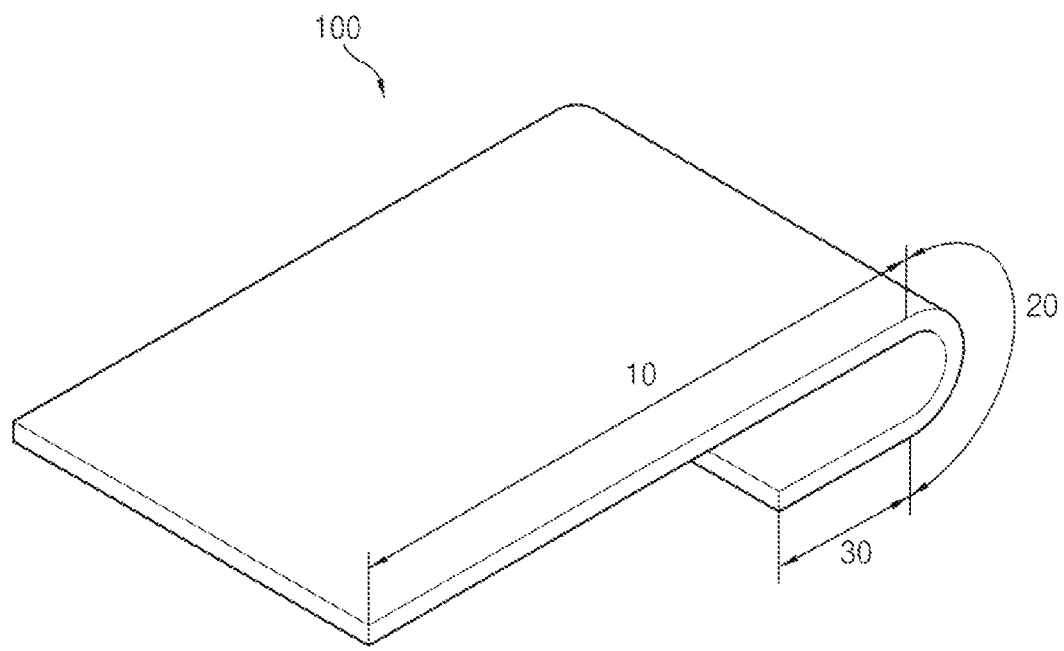
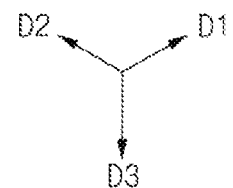

DISPLAY DEVICE HAVING DISCHARGE PATTERNS IN A PAD AREA TO DISCHARGE STATIC ELECTRICITY INTRODUCED INTO A DRIVER

CROSS-REFERENCE TO RELATED APPLICATION(S)

This application claims priority to and benefits of Korean Patent Application No. 10-2021-0009474 under 35 U.S.C. § 119, filed on Jan. 22, 2021, the entire contents of which are incorporated herein by reference.

BACKGROUND

1. Technical Field

Embodiments provide generally to display device including a driver.

2. Description of The Related Art

Flat panel display devices have replaced cathode ray tube display devices because of their characteristics such as light weight and thinness. Examples of such the flat panel displays include a liquid crystal displays and an organic light emitting displays.

The display device may include a substrate and the substrate may be divided into a display area and a pad area. A pixel structure may be disposed in the display area on the substrate and an image may be displayed through the pixel structure.

A driver, signal pads, and other components may be disposed in the pad area on the substrate. After image signals from an external device capable of generating image signals are provided to the driver through signal pads, the image signal provided to the driver may be provided to the pixel structure.

Static electricity may occur during a manufacturing process of the display device, and the static electricity may damage the pixel structure, the driver, and the components formed on a substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device including a driver.

A display device according to an embodiment may include a substrate, input pads, output pads, a driver, discharge patterns, and ground lines. The substrate may include a display area and a pad area. The input pads may be disposed in a first portion of the pad area of the substrate. The output pads may be disposed in a second portion of the pad area of the substrate. The driver may be disposed on the input pads and the output pads. The discharge patterns may be disposed adjacent to the driver in the pad area of the substrate. The ground lines may electrically connect the discharge patterns and at least one of the input pads in the pad area of the substrate.

In an embodiment, the discharge patterns may include a metal material. The discharge patterns may overlap at least a portion of the driver in the pad area of the substrate.

In an embodiment, the input pads may be spaced apart from each other in a first direction. The discharge patterns may be spaced apart from each other in a second direction different from the first direction.

In an embodiment, the discharge patterns may include first discharge patterns disposed in a third portion of the pad area and second discharge patterns disposed in a fourth portion of the pad area. The first portion of the pad area and the second portion of the pad area may face each other. The third portion of the pad area and the fourth portion of the pad area may face each other.

In an embodiment, the display device may further include a touch circuit disposed in the pad area of the substrate, and touch ground lines electrically connecting the touch circuit and the discharge patterns.

In an embodiment, the display device may further include a gate electrode disposed in the display area of the substrate, a drain electrode disposed on the gate electrode, a pixel structure disposed on the drain electrode, a connection electrode disposed between the drain electrode and the pixel structure, and electrically connecting the drain electrode and pixel structure, and a sensing structure disposed on the pixel structure.

In an embodiment, each of the ground lines may have a multilayer structure and may include at least one conductive layer.

In an embodiment, each of the ground lines may include a first conductive layer disposed in the pad area of the substrate, a second conductive layer disposed on the first conductive layer, and a third conductive layer disposed on the second conductive layer.

In an embodiment, the first conductive layer and the gate electrode may be disposed on a same layer. The second conductive layer and the drain electrode may be disposed on a same layer. The third conductive layer and connection layer may be disposed on a same layer.

In an embodiment, the sensing structure may include a lower touch insulating layer disposed on the pixel structure, a sensing connection pattern disposed on the lower touch insulating layer, an interlayer touch insulating layer disposed on the sensing connection pattern, and a sensing electrode pattern disposed on the interlayer touch insulating layer.

In an embodiment, the discharge patterns and at least one of the gate electrode, the drain electrode, the connection electrode, the sensing connection electrode, and the sensing electrode pattern may be disposed on a same layer.

In an embodiment, the touch ground lines and at least one of the sensing connection pattern and the sensing electrode pattern may be disposed on a same layer.

A display device according to an embodiment may include a substrate, input pads, output pads, a driver, discharge patterns, a guard pattern, and ground lines. The substrate may include a display area and a pad area. The input pads may be disposed in a first portion of the pad area of the substrate. The output pads may be disposed in a second portion of the pad area of the substrate. The driver may be disposed on the input pads and the output pads. The discharge patterns may be disposed adjacent to the driver in the pad area of the substrate. The guard pattern may be disposed adjacent to the driver in the pad area of the substrate. The ground lines may electrically connect the discharge patterns, the guard pattern, and at least one of the input pads, in the pad area of the substrate.

In an embodiment, the guard pattern may have a rectangular shape with one side open.

In an embodiment, the guard pattern and the discharge patterns may be disposed on a same layer.

In an embodiment, the discharge patterns and the guard pattern may include a metal material.

In an embodiment, the guard pattern may surround the output pads and the discharge patterns.

In an embodiment, the discharge patterns and the guard pattern may overlap at least a portion of the driver in the pad area of the substrate.

In an embodiment, the discharge patterns may include first discharge patterns disposed in a third portion of the pad area, and second discharge patterns disposed in a fourth portion of the pad area. The first portion of the pad area of the substrate and the second portion of the pad area of the substrate may face each other. The third portion and the fourth portion of the pad area of the substrate may face each other.

In an embodiment, the display device may further include a touch circuit disposed in the pad area of the substrate, and touch ground lines electrically connecting the touch circuit, the discharge patterns, and the guard pattern.

A display device according to an embodiment may include discharge patterns disposed adjacent to a driver in a pad area of the substrate, and ground lines electrically connecting at least one of input pads and the discharge patterns. Accordingly, during the manufacturing process of the display device, static electricity introduced into the driver may be induced to the discharge patterns and may be discharged to the outside through the ground lines and the input pads, thereby preventing damage to the driver from static electricity.

BRIEF DESCRIPTION OF THE DRAWINGS

The above and other aspects and features of the disclosure will become more apparent by describing in detail embodiments thereof with reference to the attached drawings.

FIG. 2 is a schematic perspective view illustrating a bent shape of the display device of FIG. 1.

DETAILED DESCRIPTION OF THE EMBODIMENTS

Figure 1:
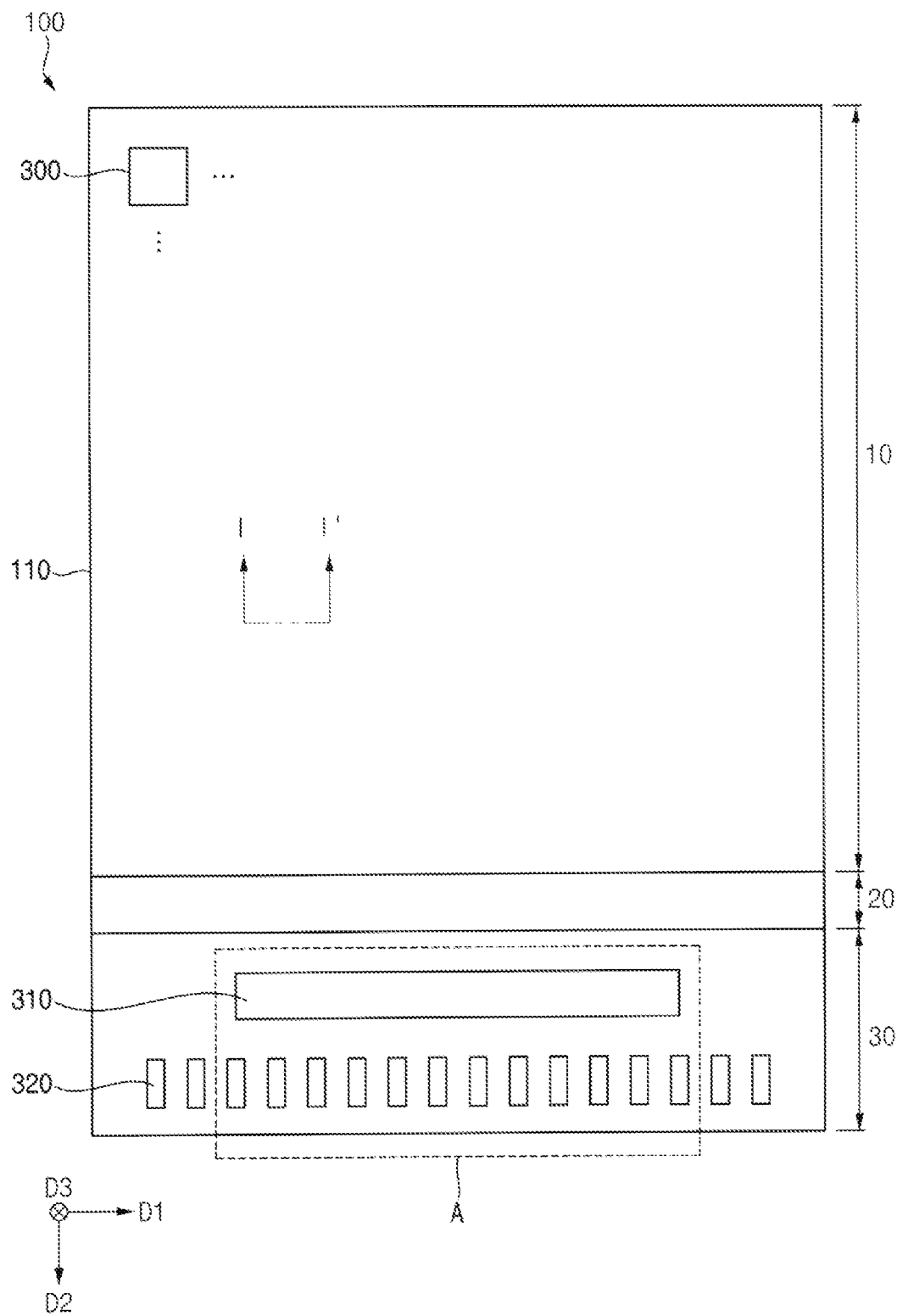
FIG. 1 is a schematic plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
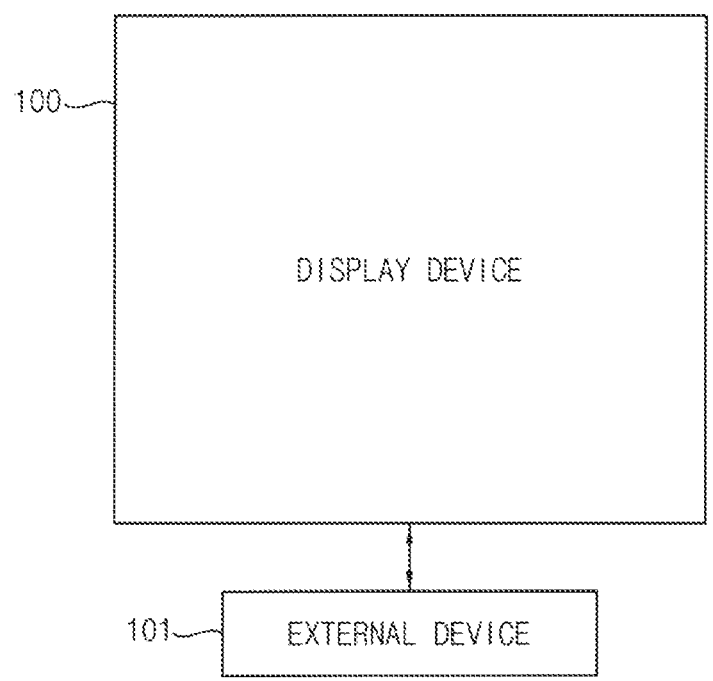
FIG. 3 is a block diagram illustrating an external device electrically connected to the display device of FIG. 1.

FIG. 1 is a schematic plan view illustrating a display device according to an embodiment. FIG. 2 is a schematic perspective view illustrating a bent shape of the display device of FIG. 1. FIG. 3 is a block diagram illustrating an external device electrically connected to the display device of FIG. 1.

In FIGS. 1, 2, and 3, the display device 100 may include a substrate 110, a pixel structure 300, a driver 310, signal pads 320, and other components.

The substrate 110 may include a transparent or opaque material. The substrate 110 may be formed of a transparent resin substrate. For example, the transparent resin substrate that may be used as the substrate 110 may be a polyimide substrate. The polyimide substrate may include a first polyimide layer, a barrier film layer, a second polyimide layer, and layers including similar materials.

The substrate 110 may include a display area 10, a bending area 20, and a pad area 30. The pad area 30 may be spaced apart from one side of the display area 10 in a second direction D2 parallel to an upper surface of the substrate 110. The bending area 20 may be positioned between the display area 10 and the pad area 30. As shown in FIG. 2, the bending area 20 may be bent along the first direction D1 orthogonal to the second direction D2. The pad area 30 and the display area 10 may overlap each other in a third direction D3 orthogonal to the first direction D1 and the second direction D2.

Signal pads 320 may be disposed in the pad area 30 on the substrate 110. The signal pads 320 may be disposed to be spaced apart from each other in the first direction D1. Each of the signal pads 320 may include at least one of a metal, an alloy, a metal nitride, a conductive metal oxide, a transparent conductive material, and the like. These may be used alone or in combination with each other. In other embodiments, each of the signal pads 320 may have a multilayer structure including multiple metal layers. For example, the metal layers may have different thicknesses or may include different materials. The external device 101 may be electrically connected to the display device 100 through a flexible printed circuit board ("FPCB") and signal pads 320, and may provide a gate signal, a data signal, a gate initialization signal, an initialization voltage, a light emitting control signal, a power voltage, and the like to the pixel structure 300.

Pixel structures 300 that emit light may be disposed in the display area 10 on the substrate 110. The pixel structures 300 may be arranged in the first direction D1 and the second direction D2 orthogonal to the first direction D1 in the display area 10.

Although not shown in detail in FIG. 1, lines electrically connected to the pixel structures 300 may be disposed in the display area 10. For example, the lines may include a data signal line, a gate signal line, a light emitting control signal line, a gate initialization signal line, a power voltage line, and the like.

However, in the display device 100, a shape of each of the display area 10, the bending area 20, and the pad area 30 is described as having a rectangular shape, but the shape is not limited thereto. For example, the shape of each of the display area 10, the bending area 20, and the pad area 30 may have a triangular planar shape, a rhombus planar shape, a polygonal planar shape, a circular planar shape, and a track-type planar shape, or an oval-shaped planar shape.

In an embodiment, the driver 310 may be disposed in the pad area 30 on the substrate 110. The driver 310 may be mounted on the substrate 110.

Figure 4:
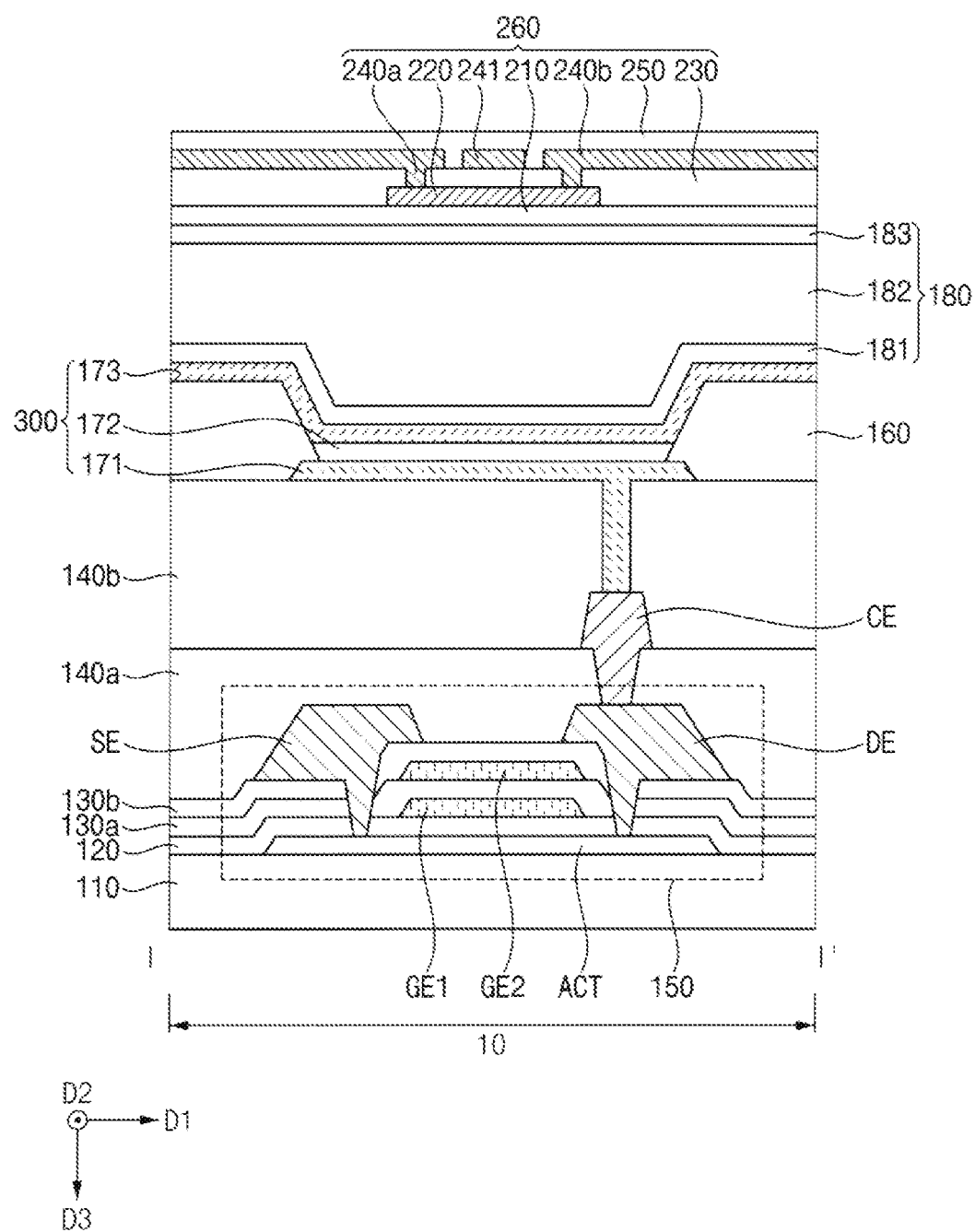
FIG. 4 is a schematic cross-sectional view taken along line I-I' of FIG. 1.
Figure 5:
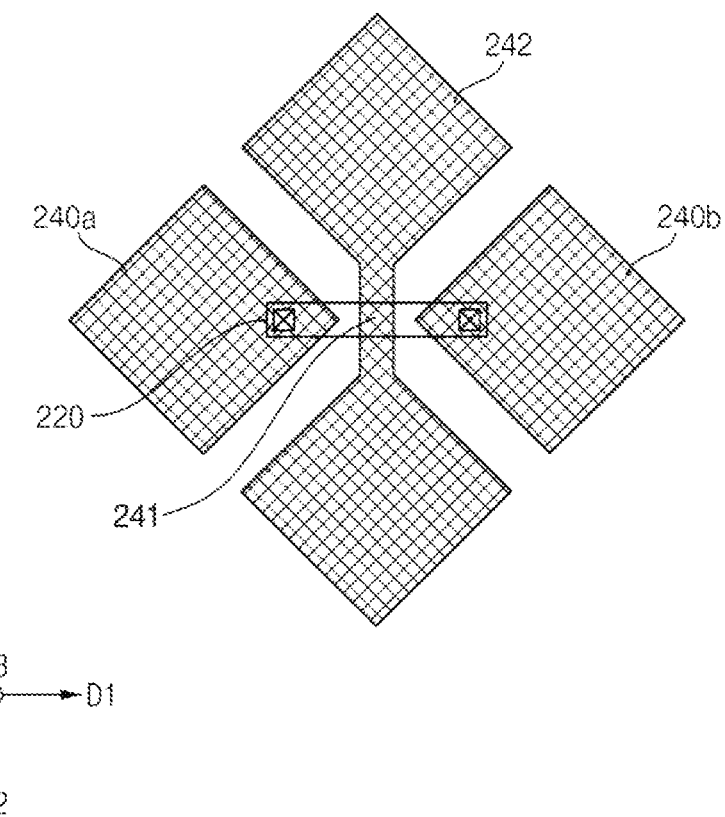
FIG. 5 is a schematic plan view illustrating a touch sensing structure included in the display device of FIG. 4.

FIG. 4 is a schematic cross-sectional view taken along line I-I' of FIG. 1. FIG. 5 is a schematic plan view illustrating a touch sensing structure included in the display device of FIG. 4. For example, FIG. 4 is a schematic cross-sectional view illustrating the display area 10 of the display device 100 of FIG. 1.

In FIGS. 4 and 5, the display device 100 may include the substrate 110, a gate insulating layer 120, a first interlayer insulating layer 130a, a second interlayer insulating layer 130b, a semiconductor element 150, a first planarization layer 140a, a second planarization layer 140b, a connection electrode CE, a pixel defining layer 160, the pixel structure 300, a thin film encapsulation structure 180, a sensing structure 260, and the like. Here, the semiconductor element 150 may include an active layer ACT, a first gate electrode GE1, a second gate electrode GE2, a source electrode SE, and a drain electrode DE, and the pixel structure 300 may include a lower electrode 171, a light emitting layer 172, and an upper electrode 173. The thin film encapsulation structure 180 may include a first inorganic thin film encapsulation layer 181, an organic encapsulation layer 182, and a second inorganic thin film encapsulation layer 183, and the sensing structure 260 may include a sensing connection pattern 220, a first sensing electrode pattern 240a, a second sensing electrode pattern 240b, and a connection portion 241.

A buffer layer may be disposed on the substrate 110. The buffer layer may prevent diffusion of metal atoms or impurities from the substrate 110 to an upper structure (e.g., the semiconductor element 150, the pixel structure 300, etc.), and may control a heat transfer rate during a crystallization process for forming the active layer ACT to obtain a substantially uniform active layer ACT. When a surface of the substrate 110 is not uniform, the buffer layer may serve to improve a flatness of the surface of the substrate 110. For example, the buffer layer may include an organic insulating material or an inorganic insulating material.

The active layer ACT may be disposed in the display area 10 on the substrate 110. The active layer ACT may include a metal oxide semiconductor, an inorganic semiconductor (e.g., amorphous silicon, poly silicon), an organic semiconductor, and the like. The active layer ACT may include a source region, a drain region, and a channel region positioned between the source region and the drain region.

Figure 7:
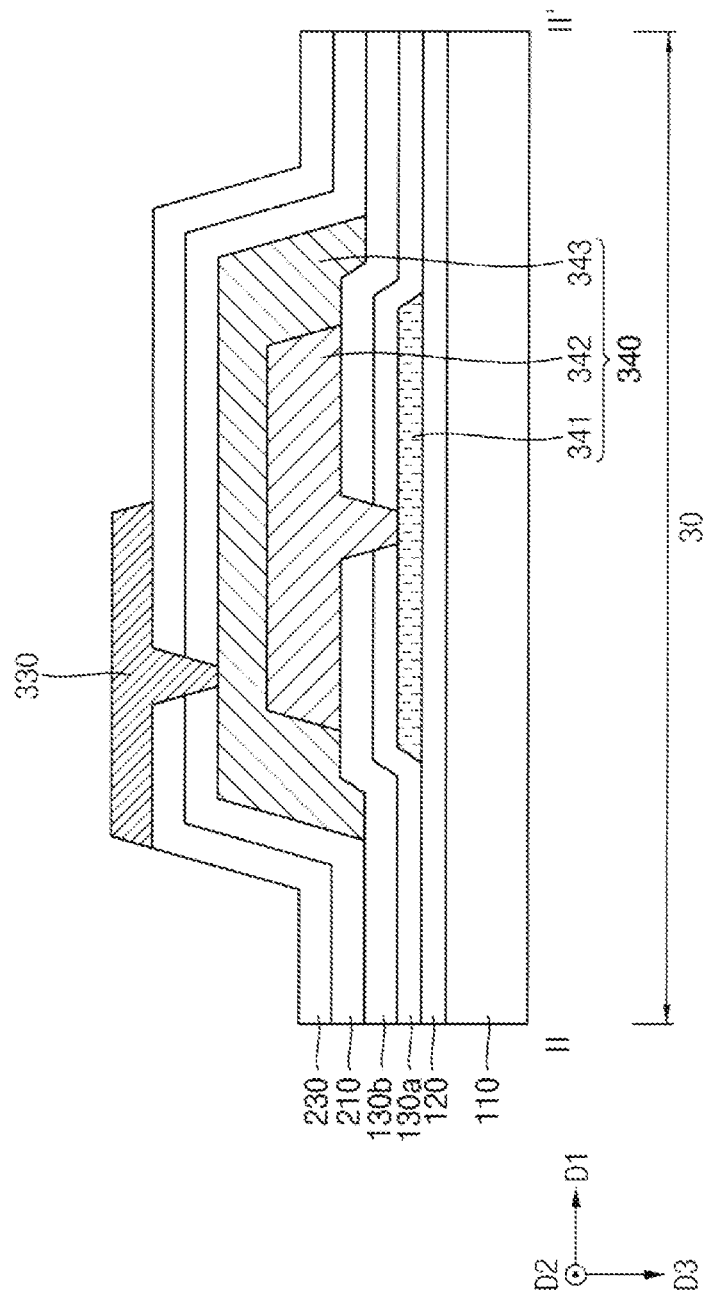
FIG. 7 is a schematic cross-sectional view taken along line II-II' of FIG. 5.

The gate insulating layer 120 may be disposed in the display area 10 and the pad area 30 on the substrate 110 (refer to FIGS. 4 and 7). The gate insulating layer 120 may cover the active layer ACT on the substrate 110 and may be disposed along a profile of the active layer ACT with a uniform thickness. In other embodiments, the gate insulating layer 120 may have sufficient thickness to cover the active layer ACT without generating a step around the active layer ACT and may have a substantially flat top surface.

The gate insulating layer 120 may include a silicon compound, or a metal oxide. For example, the gate insulating layer 120 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like.

The first gate electrode GE1 may be disposed in the display area 10 on the gate insulating layer 120. The first gate electrode GE1 may overlap the channel region of the active layer ACT. For example, the first gate electrode GE1 may include at least one of a metal, a metal alloy, a metal nitride, a conductive metal oxide, a transparent conductive material, and the like.

The first interlayer insulating layer 130a may be disposed in the display area 10 and the pad area 30 on the gate insulating layer 120 (refer to FIGS. 4 and 7). The first interlayer insulating layer 130a may cover the first gate electrode GE1 and may be disposed to have a uniform thickness. In other embodiments, the first interlayer insulating layer 130a may have a substantially flat top surface without generating a step around the first gate electrode GE1 on the gate insulating layer 120. The first interlayer insulating layer 130a may include a silicon compound, a metal oxide, and the like.

The second gate electrode GE2 may be disposed in the display area 10 on the first interlayer insulating layer 130a. The second gate electrode GE2 may overlap the first gate electrode GE1. For example, the second gate electrode GE2 may include at least one of a metal, a metal alloy, a metal nitride, a conductive metal oxide, a transparent conductive material, and the like. These may be used alone or in combination with each other.

The second interlayer insulating layer 130b may be disposed in the display area 10 and the pad area 30 on the first interlayer insulating layer 130a (refer to FIGS. 4 and 7). The second interlayer insulating layer 130b may cover the second gate electrode GE2 and may be disposed to have a uniform thickness. In other embodiments, the second interlayer insulating layer 130b may cover the second gate electrode GE2 without generating a step and may have a substantially flat top surface. The second interlayer insulating layer 130b may include a silicon compound, a metal oxide, and the like. These may be used alone or in combination with each other.

The source electrode SE and the drain electrode DE may be disposed in the display area 10 on the second interlayer insulating layer 130b. The source electrode SE may be electrically connected to the source region of the active layer ACT through a contact hole formed by removing a first portion of the gate insulating layer 120, the first interlayer insulating layer 130a, and the second interlayer insulating layer 130b. The drain electrode DE may be electrically connected to the drain region of the active layer ACT through a contact hole formed by removing a second portion of the gate insulating layer 120, the first interlayer insulating layer 130a, and the second interlayer insulating layer 130b. For example, each of the source electrode SE and the drain electrode DE may include at least one of a metal, a metal alloy, a metal nitride, a conductive metal oxide, a transparent conductive material, and the like. These may be used alone or in combination with each other.

The first planarization layer 140a may be disposed in the display area 10 on the second interlayer insulating layer 130b, the source electrode SE, and the drain electrode DE. The first planarization layer 140a may not be disposed in the pad area 30 on the second interlayer insulating layer 130b. The first planarization layer 140a may not be disposed in an area overlapping the driver 310 on the second interlayer insulating layer 130b (refer to FIGS. 1 and 7). For example, the first planarization layer 140a may be disposed to have a thickness sufficient to cover the source electrode SE and the drain electrode DE on the second interlayer insulating layer 130b. The first planarization layer 140a may have a substantially flat top surface. To implement such a flat top surface of the first planarization layer 140a, a planarization process may be performed on the first planarization layer 140a. The first planarization layer 140a may have a contact hole exposing an upper surface of the drain electrode DE. The first planarization layer 140a may include an organic insulating material or an inorganic insulating material. In an embodiment, the first planarization layer 140a may include an organic insulating material. For example, the first planarization layer 140a may include a photoresist, a polyacryl-based resin, a polyimide-based resin, a polyamide-based resin, a siloxane-based resin, an acrylic-based resin, an epoxy-based resin, and the like.

The connection electrode CE may be disposed in the display area 10 on the first planarization layer 140a. The connection electrode CE may electrically contact the drain electrode DE through the contact hole of the first planarization layer 140a. For example, the connection electrode CE may include at least one of a metal, a metal alloy, a metal nitride, a conductive metal oxide, a transparent conductive material, and the like. These may be used alone or in combination with each other.

The second planarization layer 140b may be disposed on the connection electrode CE and the first planarization layer 140a. The second planarization layer 140b may not be disposed in the pad area 30. The second planarization layer 140b may not be disposed in an area overlapping the driver 310 (refer to FIGS. 1 and 7). For example, the second planarization layer 140b may have a thickness sufficient to cover the source electrode SE and the drain electrode DE on the first planarization layer 130b. The second planarization layer 140b may have a substantially flat top surface. To implement such a flat top surface of the second planarization layer 140b, a planarization process may be performed on the second planarization layer 140b. The second planarization layer 140b may have a contact hole exposing the upper surface of the drain electrode DE. For example, the second planarization layer 140b may include an organic insulating material or an inorganic insulating material.

The lower electrode 171 may be disposed in the display area 10 on the second planarization layer 140b. The lower electrode 171 may electrically contact the connection electrode CE through the contact hole of the second planarization layer 140b, and the lower electrode 171 may be electrically connected to the semiconductor element 150. For example, the lower electrode 171 may include at least one of a metal, a metal alloy, a metal nitride, a conductive metal oxide, a transparent conductive material, and the like. These may be used alone or in combination with each other.

The pixel defining layer 160 may be disposed in the display area 10 on the second planarization layer 140b. The pixel defining layer 160 may not be disposed in the pad area 30 (refer to FIG. 7). The pixel defining layer 160 may be disposed on a part of the lower electrode 171 and the second planarization layer 140b in the display area 10. The pixel defining layer 160 may cover both sides of the lower electrode 171 and may have an opening exposing an upper surface of the lower electrode 171. For example, the pixel defining layer 160 may include an organic insulating material or an inorganic insulating material.

The light emitting layer 172 may be disposed in the display area 10 on the lower electrode 171. The light emitting layer 172 may be disposed on the lower electrode 171 exposed by the opening of the pixel defining layer 160. The light emitting layer 172 may be formed using at least one of light emitting materials capable of emitting red light, green light, and blue light depending on a type of sub pixel. In other embodiments, the light emitting layer 172 may emit white light by stacking light emitting materials capable of generating different color lights such as red light, green light, and blue light.

The upper electrode 173 may be disposed in the display area 10 on the pixel defining layer 160 and the light emitting layer 172. For example, the upper electrode 173 may include at least one of a metal, a metal alloy, a metal nitride, a conductive metal oxide, a transparent conductive material, and the like. These may be used alone or in combination with each other.

The first inorganic thin film encapsulation layer 181 may be disposed on the upper electrode 173. The first inorganic thin film encapsulation layer 181 may cover the upper electrode 173 and may be disposed along a profile of the upper electrode 173 with a uniform thickness. The first inorganic thin film encapsulation layer 181 may prevent damage to the pixel structure 300 from moisture or oxygen. The first inorganic thin film encapsulation layer 181 may also protect the pixel structure 300 from external impact. For example, the first inorganic thin film encapsulation layer 181 may include flexible inorganic insulating materials.

The organic thin film encapsulation layer 182 may be disposed on the first inorganic thin film encapsulation layer 181. The organic thin film encapsulation layer 182 may improve flatness of the display device 100 and may protect the pixel structure 300 together with the first inorganic thin film encapsulation layer 181. For example, the organic thin film encapsulation layer 182 may include flexible organic insulating materials.

The second inorganic thin film encapsulation layer 183 may be disposed on the organic thin film encapsulation layer 182. The second inorganic thin film encapsulation layer 183 may cover the organic thin film encapsulation layer 182 and may be disposed along a profile of the organic thin film encapsulation layer 182 with a uniform thickness. The second inorganic thin film encapsulation layer 183 together with the first inorganic thin film encapsulation layer 181 may prevent damage to the pixel structure 300 from moisture or oxygen. The second inorganic thin film encapsulation layer 183 may also protect the pixel structure 300 from external impacts together with the first inorganic thin film encapsulation layer 181 and the organic thin film encapsulation layer 182. For example, the second inorganic thin film encapsulation layer 183 may include flexible inorganic insulating materials.

In other examples, the thin film encapsulation structure 180 may have a five-layer structure stacked with three inorganic thin film encapsulation layers and two organic thin film encapsulation layers or a seven-layer structure stacked with four inorganic thin film encapsulation layers and three organic thin film encapsulation layers.

The lower touch insulating layer 210 may be disposed in the display area 10 on the second inorganic thin film encapsulation layer 183. For example, the lower touch insulating layer 210 may include an inorganic insulating material or an organic insulating material. In other embodiments, the lower touch insulating layer 210 may have a multilayer structure including multiple insulating layers. For example, the insulating layers may have different thicknesses or may include different materials.

The sensing connection pattern 220 may be disposed in the display area 10 on the lower touch insulating layer 210. As shown in FIG. 5, the sensing connection pattern 220 may electrically connect the first sensing electrode pattern 240a and the second sensing electrode pattern 240b through contact holes. For example, the sensing connection pattern 220 may include at least one of a metal, an alloy, a metal nitride, a conductive metal oxide, a transparent conductive material, and the like. These may be used alone or in combination with each other.

The interlayer touch insulating layer 230 may be disposed in the display area 10 on the lower touch insulating layer 210 and the sensing connection pattern 220. The interlayer touch insulating layer 230 may sufficiently cover the sensing connection pattern 220. For example, the interlayer touch insulating layer 230 may include an organic insulating material or an inorganic insulating material. In other embodiments, the interlayer touch insulating layer 230 may have a multilayer structure including multiple insulating layers. For example, the insulating layers may have different thicknesses or may include different materials.

The first sensing electrode pattern 240a, the second sensing electrode pattern 240b, and the connection portion 241 may be disposed in the display area 10 on the interlayer touch insulating layer 230. As shown in FIG. 5, a third sensing electrode pattern 242 may be disposed in the display area 10 on the interlayer touch insulating layer 230, and the third sensing electrode pattern 242 may be disposed on a same layer as the connection portion 241. In an embodiment, each of the first sensing electrode pattern 240a, the second sensing electrode pattern 240b, the third sensing electrode pattern 242 and the connection portion 241 may include carbon nano tubes (CNT), a transparent conductive oxide, indium tin oxide (ITO), an indium gallium zinc oxide (IGZO), zinc oxide (ZnO), graphene, silver nanowires (AgNW), copper (Cu), chromium (Cr), and the like.

For example, the first sensing electrode pattern 240a and the second sensing electrode pattern 240b may include an electrode pattern array arranged to be spaced apart from each other in the second direction D2. The third sensing electrode pattern 242 may include an electrode pattern array extending in the second direction D2 and arranged to be spaced apart from each other in the first direction D1.

The protective layer 250 may be disposed on the interlayer touch insulating layer 230, the first sensing electrode pattern 240a, the second sensing electrode pattern 240b, and the connection portion 241. The protective layer 250 may sufficiently cover the first sensing electrode pattern 240a, the second sensing electrode pattern 240b, and the connection portion 241.

Embodiments are not limited to the structures shown in FIGS. 4 and 5 and may have a variety of structures. For example, in other embodiments, the lower touch insulating layer 210 may be omitted. The first and second sensing electrode patterns 240a and 240b and the third sensing electrode pattern 242 may be disposed on different layers, so that the first and second sensing electrode patterns 240a and 240b may have a continuous structure without the sensing connection pattern 220.

Although the display device 100 has been described in terms of an organic light emitting display device, the embodiments are not limited thereto. In other embodiments, the display device 100 may include a liquid crystal display device (LCD), a field emission display device (FED), a plasma display device (PDP), or an electrophoretic image display device (EPD).

Figure 6:
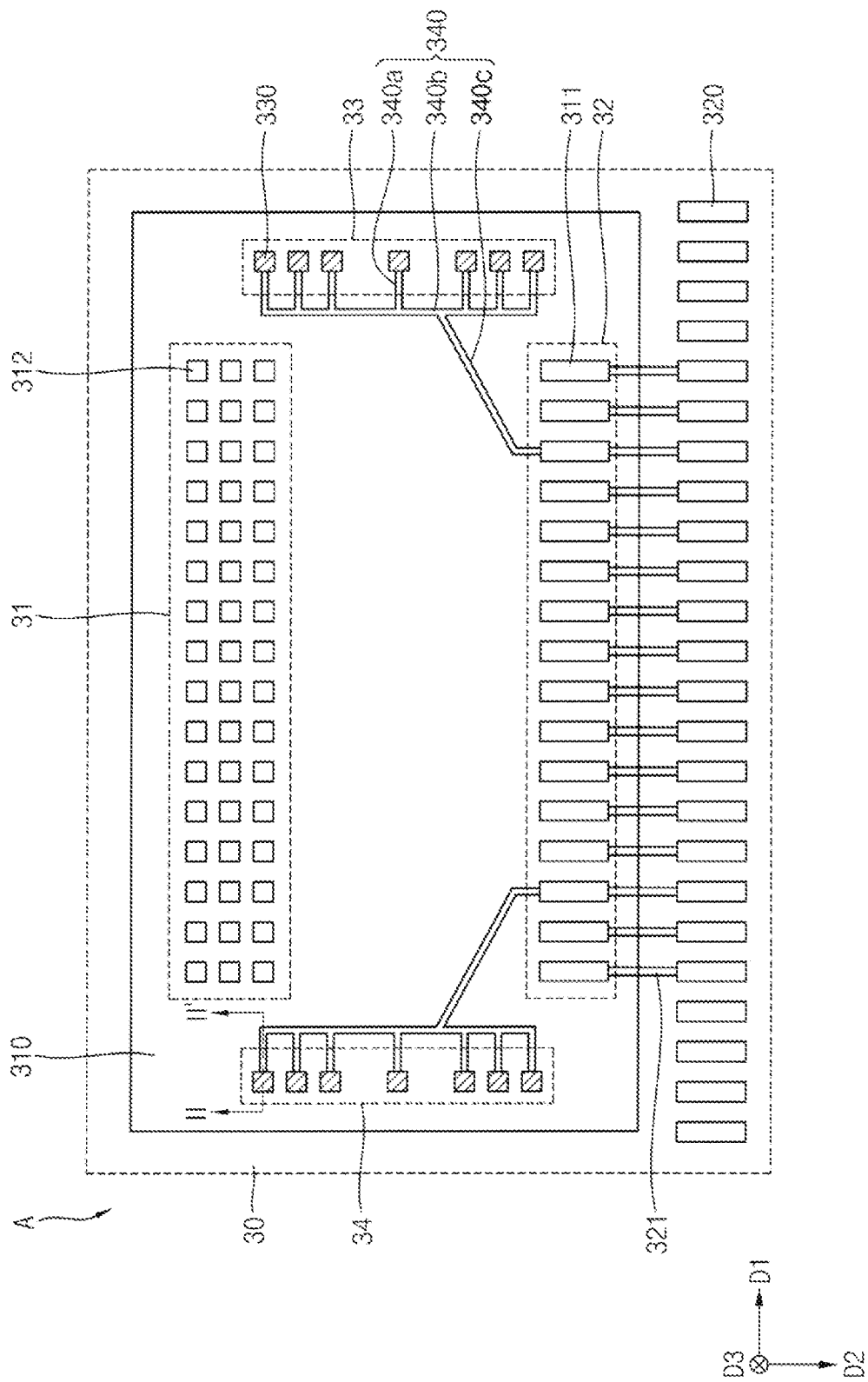
FIG. 6 is a schematic plan view illustrating an enlarged view of area "A" of FIG. 1.

FIG. 6 is a schematic plan view illustrating an enlarged view of area "A" of FIG. 1. For example, FIG. 6 is a diagram illustrating the pad area 30 of the display device 100 of FIG. 1.

Referring to FIGS. 1 and 6, the display device 100 may include the substrate 110, the driver 310, output pads 312, input pads 311, signal pads 320, discharge patterns 330, and ground lines 340.

In an embodiment, the driver 310 may be disposed on the output pads 312 and the input pads 311. The driver 310 may be bonded to the output pads 312 and the input pads 311.

The pad area 30 may be divided into a first part 32, a second part 33, a third part 33, and a fourth part 34. For example, the second part 31 may be positioned adjacent to the display area 10, and the first part 32 may be positioned adjacent to the signal pads 320. The third part 33 and the fourth part 34 may be positioned adjacent to the input pads 311 and the output pads 312. The first part 32 and the second part 31 may face from each other, and the third part 33 and the fourth part 34 may face from each other.

In an embodiment, the driver 310 may be a driver IC chip including an integrated circuit. For example, the driver IC chip may be embedded between the second part 31 and the first part 32. The driver IC chip may be electrically connected to the input pads 311 through circuit lines on a side and may be electrically connected to the output pads 312 through circuit lines on another side.

The driver IC chip may receive an input signal and a driver IC power voltage through the signal pads 320 and the input pads 311 from the external device 101 in FIG. 3. The driver IC chip may provide an output signal through lines electrically connecting the output pads 312 to the pixel structures 300 based on the input signal.

The output pads 312 and the input pads 311 may be disposed in the pad area 30 on the substrate 110. In an embodiment, the input pads 311 may be disposed in the first part 32 of the pad area 30 and the output pads 312 may be disposed in the second part 31 of the pad area 30. For example, the output pads 312 may be disposed to be spaced apart from each other in a first direction D1 and a second direction D2 orthogonal to the first direction D1. The input pads 311 may be disposed to be spaced apart from each other in the first direction D1.

Each of the output pads 312 and the input pads 311 may include at least one of a metal, an alloy, a metal nitride, a conductive metal oxide, a transparent conductive material, and the like. These may be used alone or in combination with each other. In other embodiments, each of the output pads 312 and the input pads 311 may have a multilayer structure including multiple metal layers.

As described with reference to FIG. 1, the signal pads 320 may be disposed in the pad area 30 on the substrate 110. The signal pads 320 may be disposed at a position adjacent to the first part 32 in the pad area 30 on the substrate 110. In an embodiment, each of the signal pads 320 may be electrically connected to the input pads 311 through lines 321.

In an embodiment, the discharge patterns 330 including a metal material may be disposed in the pad area 30 on the substrate 110. The discharge patterns 330 may include first discharge patterns disposed on the third part 33 of the pad area 30 and second discharge patterns disposed on the fourth part 34 of the pad area 30. For example, the discharge patterns 330 may be disposed to be spaced apart from each other in a second direction D2 different from the first direction D1.

In an embodiment, the discharge patterns 330 may be disposed adjacent to the driver 310 in the pad area 30 on the substrate 110. The discharge patterns 330 may be disposed to overlap at least a portion of the driver 310 in the pad area 30 on the substrate 110. Each of the discharge patterns 330 may be disposed between the substrate 110 and the driver 310 in the pad area 30.

In an embodiment, each of the ground lines 340 in the pad area 30 on the substrate 110 may be electrically connected to the discharge patterns 330. Each of the ground lines 340 may be electrically connected to at least one of the input pads 311.

In an embodiment, the ground lines 340 may electrically connect at least one of the input pads 311 and the discharge patterns 330. Each of the ground lines 340 may include first extension portions 340a extending in the first direction D1 and spaced apart from each other in the second direction D2 electrically connected to the discharge patterns 330. A second extension portion 340b may extend in the second direction D2 electrically connecting each of the first extension portions 340a. A third extension portion 340c may electrically connect the second extension portion 340b and at least one of the inputs pads 311. Accordingly, during the manufacturing process of the display device 100, static electricity introduced into the driver 310 may be induced to the discharge patterns 330 and may be discharged to the outside through the ground lines 340 and the input pads 311.

In a display device without a metal pattern capable of inducing static electricity introduced from the outside, the driver may be damaged by static electricity during the manufacturing process of the display device. Static electricity introduced into the output pads may damage elements inside the driver.

In the display device 100, the discharge patterns 330 including a metal material may be disposed in the pad area 30 on the substrate 110, and at least one of the input pads 311 may be electrically connected to the discharge patterns 330 through the ground lines 340. Accordingly, during the manufacturing process of the display device 100, static electricity introduced into the driver 310 may be induced to the discharge patterns 330 and may be discharged to the outside through the ground lines 340 and the input pads 311. Damage to the driver 310 from an inflow of static electricity may be prevented.

FIG. 7 is a schematic cross-sectional view taken along line II-II' of FIG. 6. For example, FIG. 7 is a schematic cross-sectional view illustrating an example of the discharge pattern 330 and the ground line 340 disposed in the pad area 30 of the display device 100 of FIG. 6.

Referring to FIGS. 4 and 7, the display device 100 may include the substrate 110, the gate insulating layer 120, the ground line 340, the first interlayer insulating layer 130a, the second interlayer insulating layer 130b, the lower touch insulating layer 210, the interlayer touch insulating layer 230, the discharge pattern 330. The ground line 340 may include a first conductive layer 341, a second conductive layer 342, and a third conductive layer 343.

The first conductive layer 341 may be disposed on the gate insulating layer 120, the second conductive layer 342 may be disposed on the second interlayer insulating layer 130a, and the third conductive layer 343 may be disposed on the second conductive layer 342. In an embodiment, the first conductive layer 341 may be disposed on the same layer as the first gate electrode GE1 shown in FIG. 4, the second conductive layer 342 may be disposed on the same layer as the source electrode SE and the drain electrode DE shown in FIG. 4, and the third conductive layer 343 may be disposed on the same layer as the connection electrode CE shown in FIG. 4. The first conductive layer 341 and the first gate electrode GE1 may contain a same material. The second conductive layer 342, the source electrode SE, and the drain electrode DE may contain a same material. The third conductive layer 343 and the connection electrode CE may contain a same material. For example, each of the first to third conductive layers 341, 342, and 343 may include at least one of a metal, an alloy, a metal nitride, a conductive metal oxide, a transparent conductive material, and the like. These may be used alone or in combination with each other.

The second conductive layer 342 may be electrically connected to the first conductive layer 341 through a contact hole formed by removing a portion of the first and second interlayer insulating layers 130a and 130b, and a lower surface of the third conductive layer 343 may electrically contact an upper surface of the second conductive layer 342.

In FIG. 7, it has been described that the ground line 340 includes the first to third conductive layers 341, 342, and 343, but the embodiments are not limited thereto. The ground line 340 may have a multilayer structure including at least one conductive layer. For example, the ground line 340 may have a structure including one or two conductive layers. In other examples, the ground line 340 may have a structure including four or more conductive layers.

The discharge pattern 330 may be disposed on the interlayer touch insulating layer 230. In an embodiment, the discharge pattern 330 may be disposed on a same layer as the first sensing electrode pattern 240a and the second sensing electrode pattern 240b shown in FIG. 4. The discharge pattern 330, the first sensing electrode pattern 240a, and the second sensing electrode pattern 240b may contain a same material. For example, the discharge pattern 330 may include carbon nanotubes, transparent conductive oxide, indium tin oxide, indium gallium zinc oxide, zinc oxide, graphene, silver nanowires, copper, chromium, and the like (refer to FIG. 4).

The discharge pattern 330 may be electrically connected to the third conductive layer 343 through a contact hole formed by removing a portion of the lower touch insulating layer 210 and the interlayer touch insulating layer 230.

In FIG. 7, the discharge pattern 330 is disposed on a same layer as the first and second sensing electrode patterns 240a and 240b shown in FIG. 4, but the embodiments are not limited thereto. For example, the discharge pattern 330 may be disposed on a same layer as any one of the first gate electrode GE1, the second gate electrode GE2, the drain electrode DE, the connection electrode CE, and the sensing connection pattern 220 shown in FIG. 4.

Figure 8:
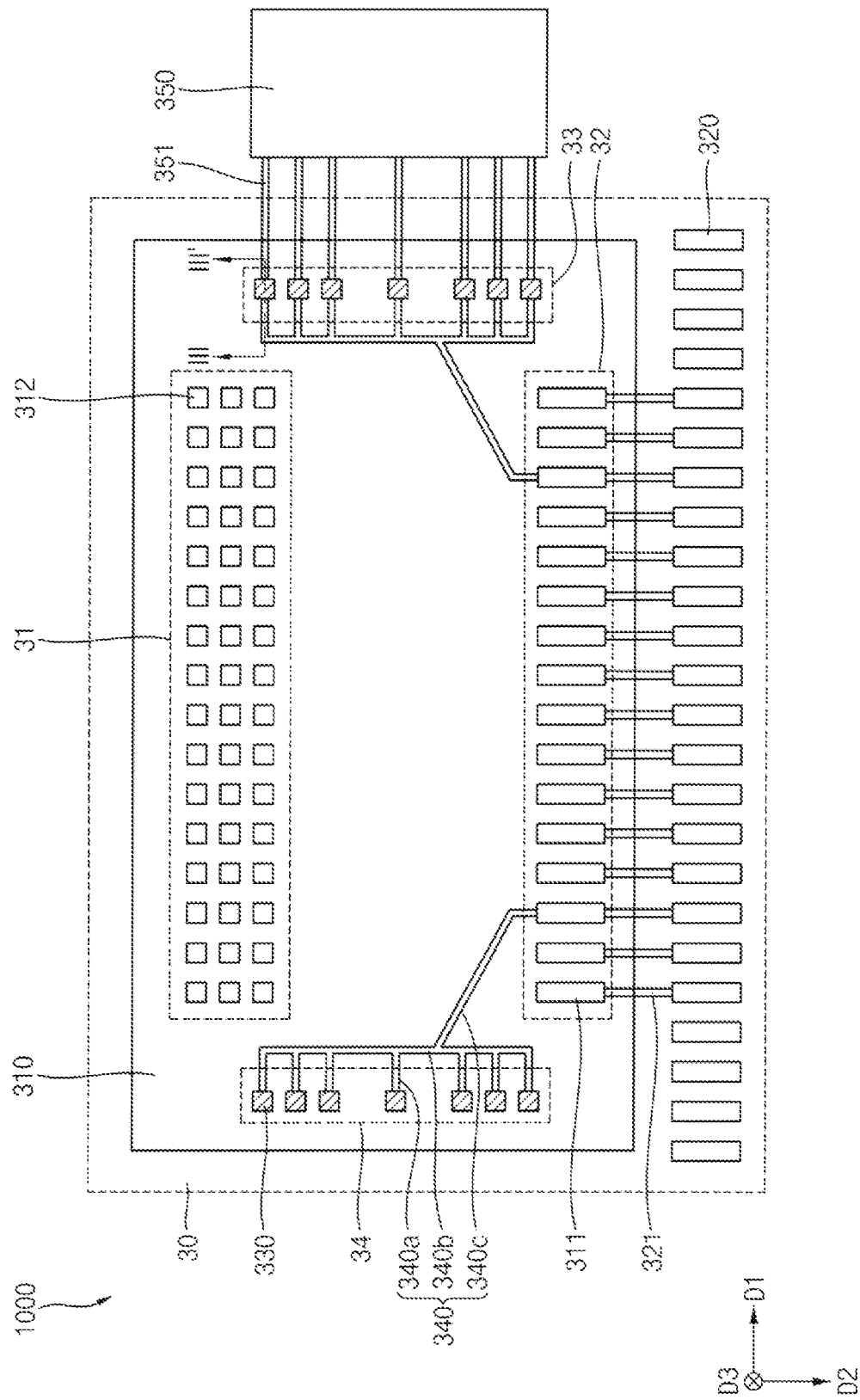
FIG. 8 is a schematic plan view illustrating a pad area of a display device according to an embodiment.

FIG. 8 is a schematic plan view illustrating a pad area of a display device 1000 according to an embodiment. The display device 1000 shown in FIG. 8 may have a configuration substantially similar to the display device 100 described in FIGS. 1 through 7 except for the touch circuit 350. In FIG. 8, descriptions of substantially similar components described above will not be repeated. FIG. 8 is a schematic plan view illustrating an enlarged view of area "A" of FIG. 1.

Referring to FIGS. 1 and 8, the display device 1000 may include the driver 310, output pads 312, input pads 311, discharge patterns 330, ground lines 340, and a touch circuit 350.

In an embodiment, the touch circuit 350 may be disposed in the pad area 30 on the substrate 110. The touch circuit 350 may be disposed in an area near the driver 310. The touch circuit 350 may be electrically connected to the sensing structure 260 shown in FIG. 4 through touch ground lines 351. The touch circuit 350 may provide necessary signals for driving the sensing structure 260 through the touch ground lines 351.

In an embodiment, the touch ground lines 351 in the pad area 30 on the substrate 110 may electrically connect the touch circuit 350 and the discharge patterns 330. Accordingly, during the manufacturing process of the display device 1000, static electricity introduced into the driver 310 may be induced to the discharge patterns 330 and may be discharged to the outside through the ground lines 340 and the input pads 311. The static electricity may be discharged to the outside through the touch ground lines 351 and the touch circuit 350. Accordingly, damage to the driver 310 from static electricity may be more effectively prevented.

Figure 9:
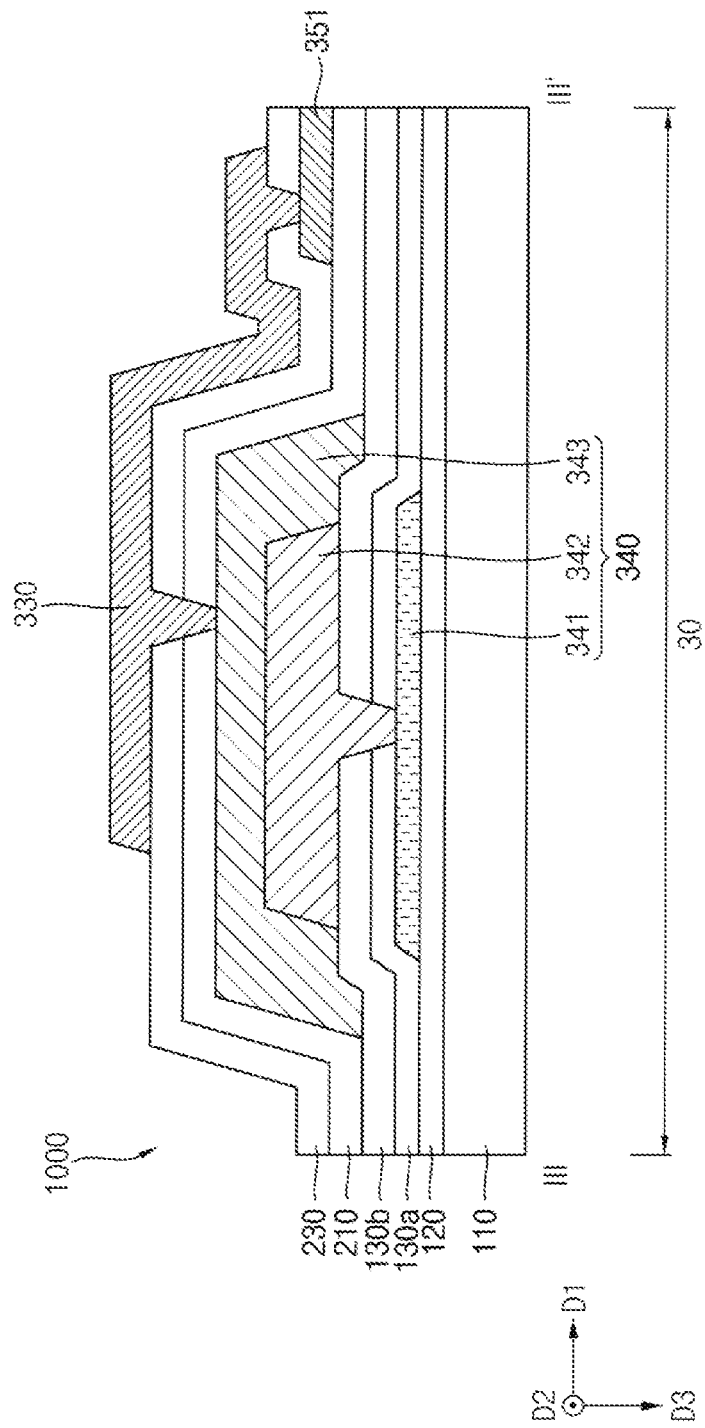
FIG. 9 is a schematic cross-sectional view taken along line of FIG. 8.

FIG. 9 is a schematic cross-sectional view taken along line of FIG. 8. The display device 1000 of FIG. 9 may have a configuration substantially similar to the display device 100 shown in FIGS. 1 through 7 except for the touch ground line 351 of the touch circuit 350. In FIG. 9, descriptions of substantially similar components described above will not be repeated.

Referring to FIG. 9, the display device 1000 may include the substrate 110, the gate insulating layer 120, the ground line 340, the first interlayer insulating layer 130a, the second interlayer insulating layer 130b, the lower touch insulating layer 210, the interlayer touch insulating layer 230, the discharge pattern 330, and the touch ground line 351. The ground line 340 may include a first conductive layer 341, a second conductive layer 342, and a third conductive layer 343.

The touch ground line 351 may be disposed on the lower touch insulating layer 210. In an embodiment, the touch ground line 351 may be disposed on a same layer as the sensing connection pattern 220 shown in FIG. 4. The touch ground line 351 and the sensing connection pattern 220 may contain a same material. For example, the touch ground line 351 may include at least one of a metal, an alloy, a metal nitride, a conductive metal oxide, a transparent conductive material, and the like. These may be used alone or in combination with each other.

The discharge pattern 330 may be electrically connected to the touch ground line 351 through a contact hole formed by removing a portion of the interlayer touch insulating layer 230.

In FIG. 9, the touch ground line 351 is disposed on a same layer as the sensing connection pattern 220 shown in FIG. 4, but the embodiments are not limited thereto. For example, the touch ground line 351 may be disposed on a same layer as the first and second sensing electrode patterns 240a and 240b shown in FIG. 4. The touch ground line 351 and first and second sensing electrode patterns 240a and 240b shown in FIG. 4 may contain a same material.

Figure 10:
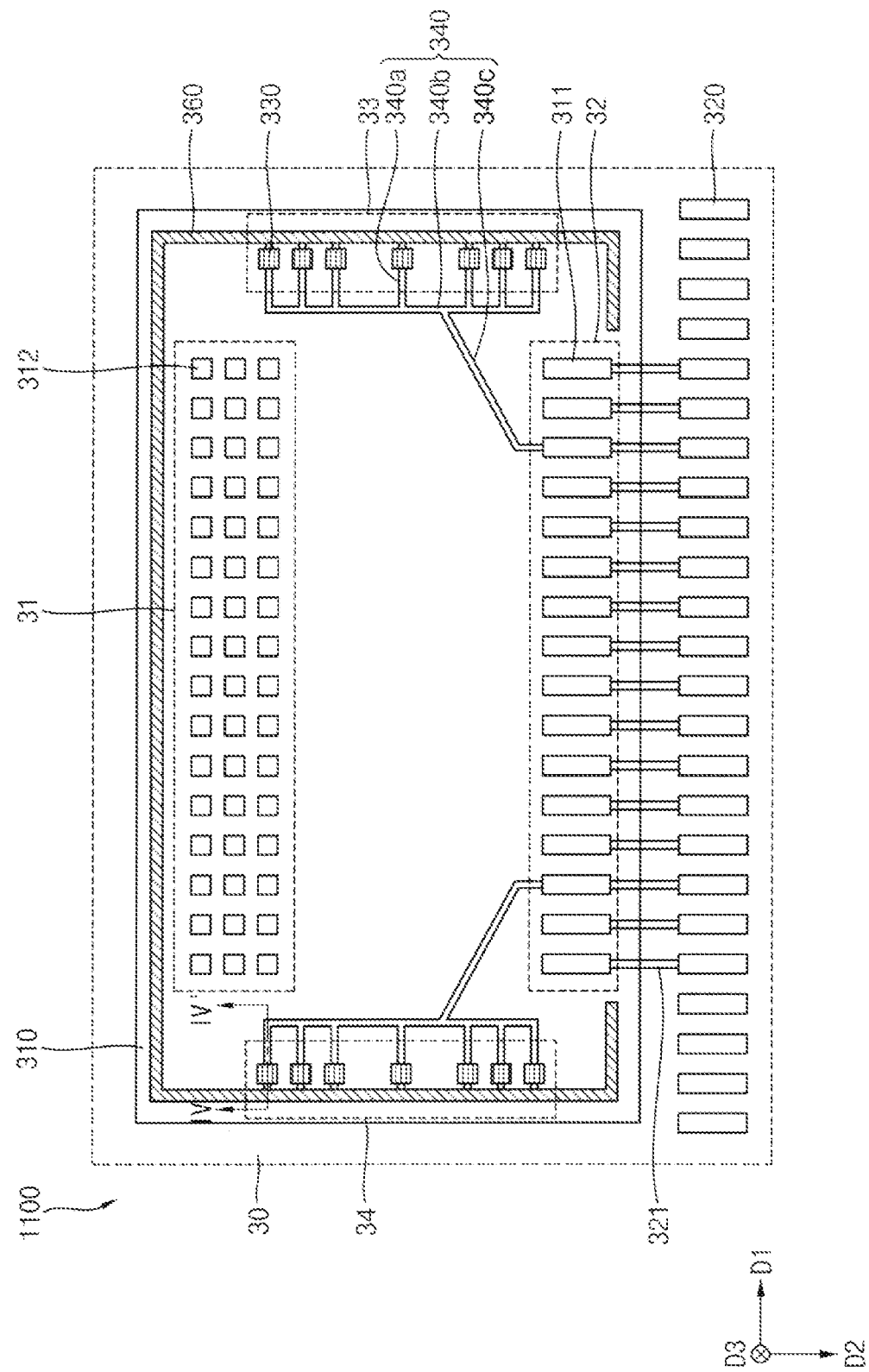
FIG. 10 is a schematic plan view illustrating a pad area of a display device according to an embodiment.

FIG. 10 is a schematic plan view illustrating a pad area of a display device 1100 according to an embodiment. The display device 1100 of FIG. 10 may have a configuration substantially similar to the display device 100 described in FIGS. 1 through 7 except for the guard pattern 360. In FIG. 10, descriptions of substantially similar components described above will not be repeated. FIG. 10 is a schematic plan view illustrating an enlarged view of area "A" of FIG. 1.

Referring to FIGS. 1 and 10, the display device 1100 may include the substrate 110, the driver 310, output pads 312, input pads 311, discharge patterns 330, ground lines 340, and a guard pattern 360.

In an embodiment, the guard pattern 360 including a metal material may be disposed in the pad area 30 on the substrate 110. The guard pattern 360 may be disposed adjacent to the driver 310. The guard pattern 360 may be disposed to overlap at least a portion of the driver 310. For example, on a plan view, the guard pattern 360 may have a rectangular shape with one side open. In a plan view, the guard pattern 360 may surround the output pads 312 and the discharge patterns 330.

In an embodiment, the ground lines 340 in the pad area 30 on the substrate 110 may electrically connect at least one of the input pads 311, the discharge patterns 330 and the guard pattern 360. For example, first extension portions 340a of the ground lines 340 may extend in a first direction D1 and may be spaced apart from each other in a second direction D2 orthogonal to the first direction D1. The first extension portions 340a may be electrically connected to the guard pattern 360. Accordingly, during the manufacturing process of the display device 1100, static electricity introduced in a direction of the driver 310 may be induced to the guard pattern 360 and may be discharged to the outside through the ground lines 340 and the input pads 311. Accordingly, damage to the driver 310 from static electricity may be more effectively prevented.

Figure 11:
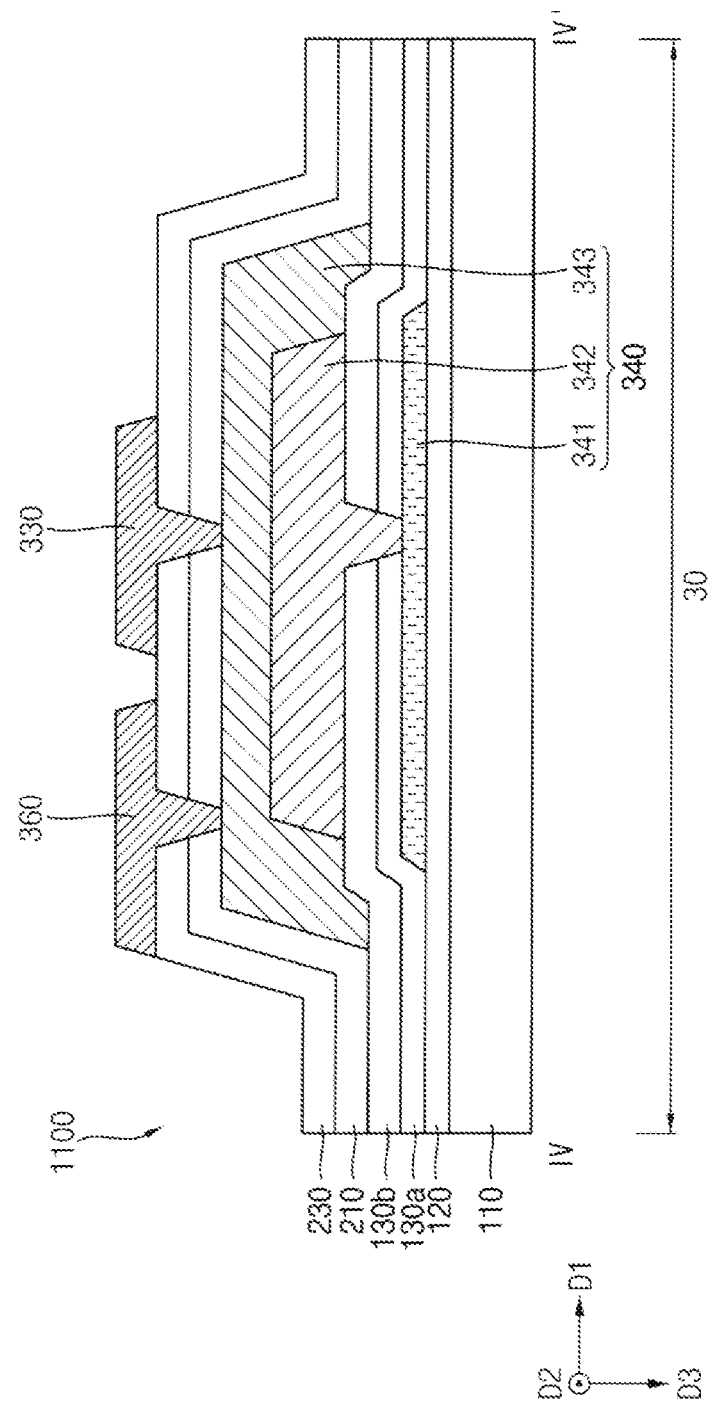
FIG. 11 is a schematic cross-sectional view taken along line IV-IV' of FIG. 10.

FIG. 11 is a schematic cross-sectional view taken along line IV-IV' of FIG. 10. However, the display device 1100 of FIG. 11 may have a configuration substantially similar to the display device 100 described in FIGS. 1 through 7 except that the display device 1100 further includes the guard pattern 360. In FIG. 11, descriptions of substantially similar components described above will not be repeated.

Referring to FIG. 11, the display device 1100 may include the substrate 110, the gate insulating layer 120, the ground line 340, the first interlayer insulating layer 130a, the second interlayer insulating layer 130b, the lower touch insulating layer 210, the interlayer touch insulating layer 230, the discharge pattern 330, and the guard pattern 360. The ground line 340 may include a first conductive layer 341, a second conductive layer 342, and a third conductive layer 343.

The guard pattern 360 may be disposed on the interlayer touch insulating layer 230. In an embodiment, the guard pattern 360 may be disposed on the same layer as the first and second sensing electrode patterns 240a and 240b. The guard pattern 360, and the first and second sensing electrode patterns 240a and 240b may contain a same material. For example, the guard pattern 360 may include carbon nanotubes, transparent conductive oxide, indium tin oxide, indium gallium zinc oxide, zinc oxide, graphene, silver nanowires, copper, chromium, and the like (refer to FIG. 4).

In an embodiment, the guard pattern 360 may be disposed on a same layer as the discharge pattern 330. In other examples, the guard pattern 360 may be disposed on a layer different from the discharge pattern 330. The guard pattern 360 may be electrically connected to the third conductive layer 343 through a contact hole formed by removing a portion of the lower touch insulating layer 210 and the interlayer touch insulating layer 230.

In FIG. 11, it has been described that the guard pattern 360 is disposed on a same layer as the first and second sensing electrode patterns 240a and 240b shown in FIG. 4, but the embodiments are not limited thereto. For example, the guard pattern 360 may be disposed on a same layer as any one of the first gate electrode GE1, the second gate electrode GE2, the drain electrode DE, the connection electrode CE, and the sensing connection pattern 220 shown in FIG. 4.

Figure 12:
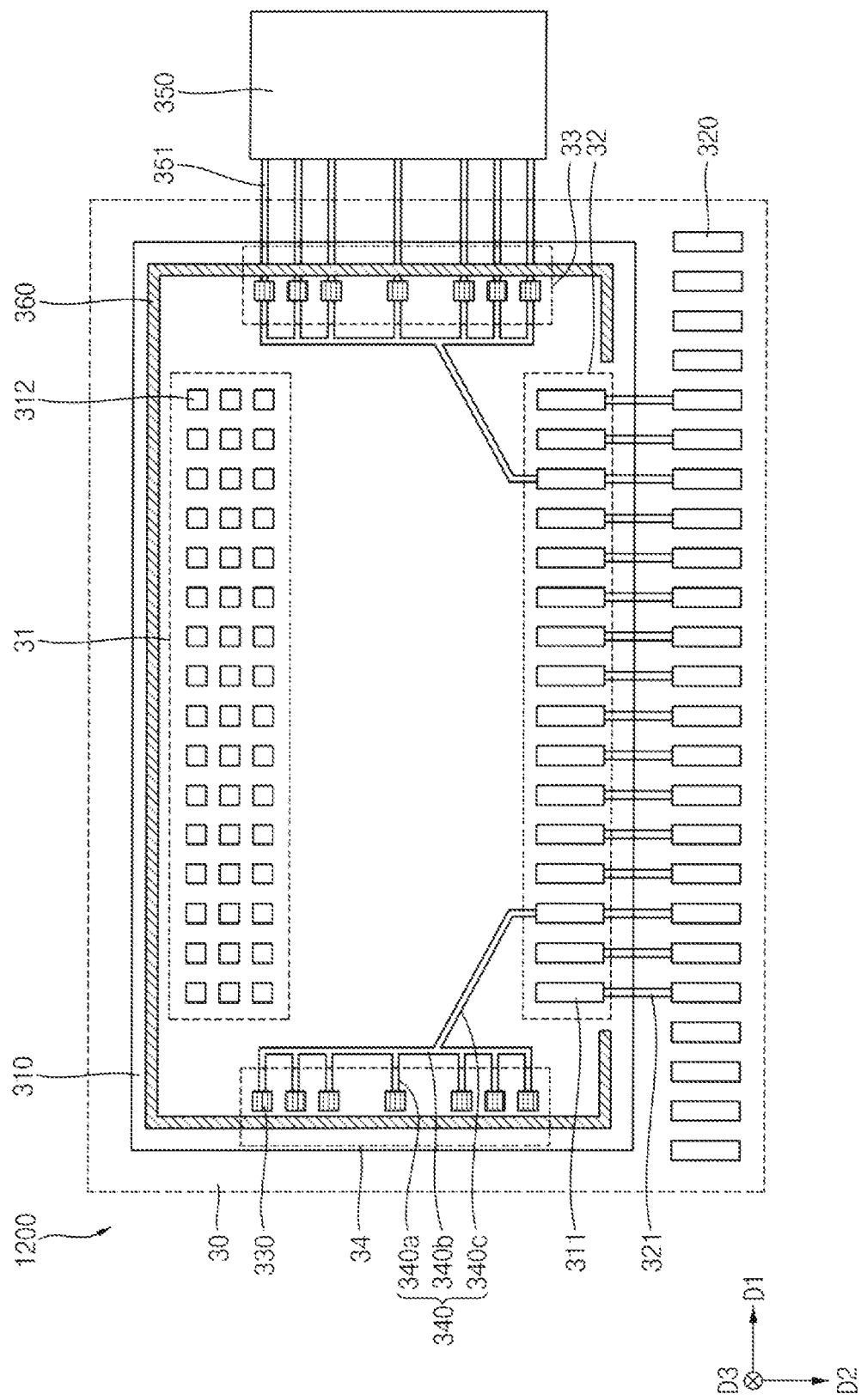
FIG. 12 is a schematic plan view illustrating a pad area of a display device according to an embodiment.

FIG. 12 is a schematic plan view illustrating a pad area of a display device according to an embodiment.

The display device 1200 of FIG. 12 may have a configuration substantially similar to the display device 1100 of FIG. 10 except that the display device 1200 includes a touch circuit 350. In FIG. 12, descriptions of substantially similar components described in FIG. 10 will not be repeated. FIG. 12 may be a schematic plan view illustrating an enlarged view of area "A" of FIG. 1.

Referring to FIGS. 1 and 12, the display device 1200 may include the substrate 110, the driver 310, ground lines 340, discharge patterns 330, input pads 311, output pads 312, signal pads 320, the guard pattern 360, the touch circuit 350, and the like.

Referring to FIG. 12, the touch circuit 350 may be disposed in the pad area 30 on the substrate 110. The touch circuit 350 may be disposed in an area near the driver 310. In an embodiment, the touch ground lines 351 may electrically connect the touch circuit 350, the discharge patterns 330, and the guard pattern 360. Accordingly, during the manufacturing process of the display device 1200, static electricity introduced into a direction of the driver 310 may be induced to the guard pattern 360 and may be discharged to the outside through the ground lines 340 and the input pads 311. The static electricity may be discharged to the outside through the touch ground lines 351 and the touch circuit 350. Accordingly, damage to the driver 310 from static electricity may be more effectively prevented.

The embodiments may be applied to a display device and an electronic device including the display device. For example, the embodiments may be applied to high-resolution smartphones, mobile phones, smart pads, smart watches, tablet PCs, vehicle navigation systems, televisions, computer monitors, notebook computers, and the like.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
a substrate including a display area and a pad area;
input pads disposed in a first portion of the pad area of the substrate;
output pads disposed in a second portion of the pad area of the substrate;
a driver disposed on the input pads and the output pads;
discharge patterns in the pad area of the substrate and disposed adjacent to the driver; and
ground lines in the pad area of the substrate, the ground lines electrically connecting the discharge patterns and at least one of the input pads.

2. A display device comprising:
a substrate including a display area and a pad area;
input pads disposed in a first portion of the pad area of the substrate;
output pads disposed in a second portion of the pad area of the substrate;
a driver disposed on the input pads and the output pads;
discharge patterns disposed adjacent to the driver in the pad area of the substrate; and
ground lines electrically connecting the discharge patterns and at least one of the input pads in the pad area of the substrate, wherein
the discharge patterns include a metal material,
the discharge patterns overlap at least a portion of the driver in the pad area of the substrate, and
the discharge patterns overlap at least a portion of the driver in a plan view corresponding to a thickness direction of the substrate.

3. The display device of claim 1, wherein
the input pads are spaced apart from each other only in a first direction, and
the discharge patterns are spaced apart from each other only in a second direction different from the first direction.

4. The display device of claim 1, wherein
the discharge patterns include:
first discharge patterns disposed in a third portion of the pad area of the substrate; and
second discharge patterns disposed in a fourth portion of the pad area of the substrate,
the first portion of the pad area of the substrate and the second portion of the pad area of the substrate face each other, and
the third portion of the pad area of the substrate and the fourth portion of the pad area of the substrate face each other.

5. The display device of claim 1, further comprising:
a touch circuit disposed in the pad area of the substrate; and
touch ground lines electrically connecting the touch circuit and the discharge patterns.

6. The display device of claim 5, further comprising:
a gate electrode disposed in the display area of the substrate;
a drain electrode disposed on the gate electrode;
a pixel structure disposed on the drain electrode;
a connection electrode disposed between the drain electrode and the pixel structure, and electrically connecting the drain electrode and pixel structure; and
a sensing structure disposed on the pixel structure.

7. The display device of claim 6, wherein each of the ground lines has a multilayer structure and includes at least one conductive layer.

8. The display device of claim 6, wherein each of the ground lines includes:
a first conductive layer disposed in the pad area of the substrate;
a second conductive layer disposed on the first conductive layer; and
a third conductive layer disposed on the second conductive layer.

9. The display device of claim 8, wherein
the first conductive layer and the gate electrode are disposed on a same layer,
the second conductive layer and the drain electrode are disposed on a same layer, and
the third conductive layer and the connection layer are disposed on a same layer.

10. The display device of claim 6, wherein the sensing structure includes:
a lower touch insulating layer disposed on the pixel structure;
a sensing connection pattern disposed on the lower touch insulating layer;
an interlayer touch insulating layer disposed on the sensing connection pattern; and
a sensing electrode pattern disposed on the interlayer touch insulating layer.

11. The display device of claim 10, wherein the discharge patterns and at least one of the gate electrode, the drain electrode, the connection electrode, the sensing connection electrode, and the sensing electrode pattern are disposed on a same layer.

12. The display device of claim 10, wherein the touch ground lines and at least one of the sensing connection pattern and the sensing electrode pattern are disposed on a same layer.

13. A display device comprising:
a substrate including a display area and a pad area;
input pads disposed in a first portion of the pad area of the substrate;
output pads disposed in a second portion of the pad area of the substrate;
a driver disposed on the input pads and the output pads;
discharge patterns disposed adjacent to the driver in the pad area of the substrate;
a guard pattern disposed adjacent to the driver in the pad area of the substrate; and
ground lines electrically connecting the discharge patterns, and the guard pattern, and at least one of the input pads in the pad area of the substrate.

14. The display device of claim 13, wherein the guard pattern has a rectangular shape with one side open.

15. The display device of claim 13, wherein the guard pattern and the discharge patterns are disposed on a same layer.

16. The display device of claim 13, wherein the discharge patterns and the guard pattern include a metal material.

17. The display device of claim 13, wherein the guard pattern surrounds the output pads and the discharge patterns.

18. The display device of claim 13, wherein the discharge patterns and the guard pattern overlap at least a portion of the driver in the pad area of the substrate.

19. The display device of claim 13, wherein
the discharge patterns include:
first discharge patterns disposed in a third portion of the pad area of the substrate; and
second discharge patterns disposed in a fourth portion of the pad area of the substrate,
the first portion of the pad area of the substrate and the second portion of the pad area of the substrate face each other, and
the third portion of the pad area of the substrate and the fourth portion of the pad area of the substrate face each other.

20. The display device of claim 13, further comprising:
a touch circuit disposed in the pad area of the substrate; and
touch ground lines electrically connecting the touch circuit, the discharge patterns, and the guard pattern.

21. The display device of claim 1, wherein
the display area includes pixel structures that emit light,
the pad area is absent of any pixel structures that emit light, and
the pad area is spaced apart from the display area by a flexible bending area.

22. The display device of claim 1, wherein
the display area includes pixel structures that emit light, and
the driver is comprised of an IC chip that receives input signals from an external device through the input pads and outputs output signals to the pixel structures through the output pads.

* * * * *